United States Patent [19]
Yamagata et al.

[11] Patent Number: 4,983,539
[45] Date of Patent: Jan. 8, 1991

[54] PROCESS FOR PRODUCING A SEMICONDUCTOR ARTICLE

[75] Inventors: Kenji Yamagata, Yokohama; Takeshi Ichikawa, Atsugi, both of Japan

[73] Assignee: Canon Kabushiki Kaisha, Tokyo, Japan

[21] Appl. No.: 508,490

[22] Filed: Apr. 13, 1990

Related U.S. Application Data

[63] Continuation of Ser. No. 159,919, Feb. 24, 1988, abandoned.

[30] Foreign Application Priority Data

Feb. 28, 1987 [JP] Japan ................................. 62-044103
Mar. 26, 1987 [JP] Japan ................................. 62-070468

[51] Int. Cl.$^5$ .......................................... H01L 21/20
[52] U.S. Cl. ...................................... 437/110; 437/83; 437/89; 437/915

[56] References Cited

U.S. PATENT DOCUMENTS

| | | | |
|---|---|---|---|
| 3,171,761 | 3/1965 | Marinace | 437/89 |
| 3,184,350 | 5/1965 | Marinace | 437/89 |
| 3,574,008 | 4/1971 | Rice | 437/89 |
| 3,793,712 | 2/1974 | Bean et al. | 437/90 |
| 3,850,707 | 11/1974 | Bestland | 437/89 |
| 3,855,690 | 12/1974 | Kim et al. | 437/89 |
| 3,884,733 | 5/1975 | Bean | 437/89 |
| 4,064,954 | 1/1977 | Tshudy et al. | 156/612 |
| 4,178,197 | 12/1979 | Marinace | 156/612 |
| 4,239,788 | 12/1980 | Beck | 427/43.1 |
| 4,530,149 | 7/1985 | Jastrzebaski et al. | 437/90 |
| 4,637,127 | 1/1987 | Kurogi et al. | 156/614 |
| 4,698,316 | 10/1987 | Corboy, Jr. et al. | 156/613 |
| 4,749,441 | 6/1988 | Christenson et al. | 437/89 |

FOREIGN PATENT DOCUMENTS

| | | |
|---|---|---|
| 0240309 | 10/1987 | European Pat. Off. . |
| 0244081 | 11/1987 | European Pat. Off. . |
| 69495 | 4/1984 | Japan . |
| 63013 | 4/1986 | Japan . |
| 0177742 | 8/1986 | Japan ................................. 437/89 |

OTHER PUBLICATIONS

IDEM 1982, Technical Digest, International Electron Devices Meeting, San Francisco, CA, pp. 798–800, G. H. Olsen et al.,: "Non-Planar VPE Growth of Low–threshold (60mA) current 1.3 mum CW lasers".
British Journal of Applied Physics, vol. 18, No. 10, Oct. 1967, pp. 1357–1382, GB; J. D. Filby et al.: "Single-Crystal Films of Silicon on Insulators".

Primary Examiner—Olik Chaudhuri
Assistant Examiner—William D. Bunch
Attorney, Agent, or Firm—Fitzpatrick, Cella, Harper & Scinto

[57] ABSTRACT

A process for producing a semiconductor article comprises applying crystal formation treatment to a substrate having a free surface on which a nonnucleation surface exhibiting a smaller nucleation density and a nucleation surface of an amorphous material exhibiting a larger nucleation density and having a sufficiently minute area so as to allow only a single nucleus to be formed thereon are disposed next to each other whereby a semiconductor monocrystal is permitted to grow from the nucleus, the production conditions during said crystal formation treatment being varied to form semiconductor crystal regions different in their characteristics within at least part of said semiconductor monocrystal.

9 Claims, 9 Drawing Sheets

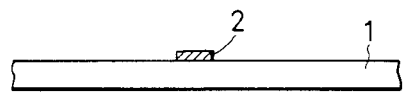
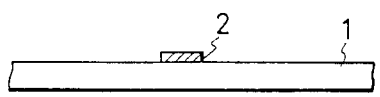
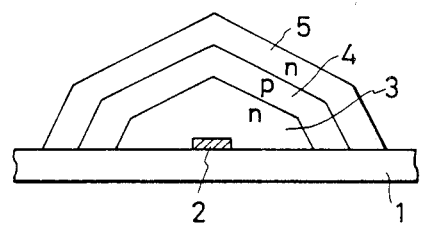
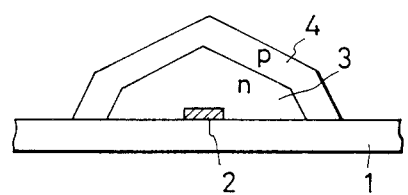
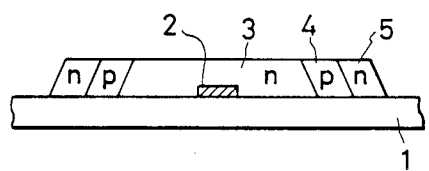
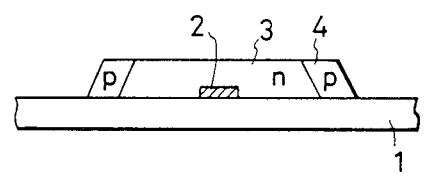
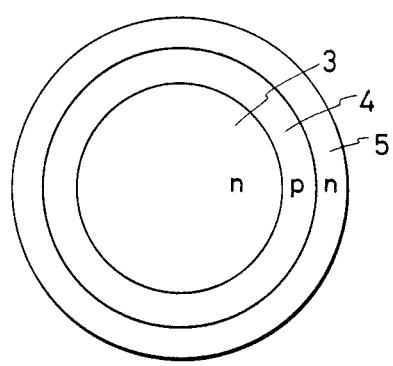
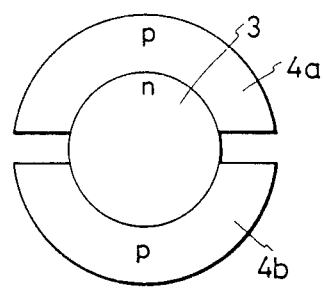

PROCESS FOR PRODUCING A SEMICONDUCTOR ARTICLE

This application is a continuation of application Ser. No. 07/159,919 filed Feb. 24, 1988, now abandoned.

BACKGROUND OF THE INVENTION

1. Field of the Invention

The present invention relates to a process for producing a semiconductor article, specifically to a process for producing a semiconductor article by applying crystal formation treatment to a substrate having a free surface on which a nonnucleation surface exhibiting a smaller nucleation density and a nucleation surface exhibiting a larger nucleation density and having a sufficiently minute area so as to allow only a single nucleus to be formed thereon are disposed next to each other, whereby a monocrystal is permitted to grow from the nucleus.

The present invention is applicable to the formation of monocrystals, polycrystals, etc. for electronic devices, optical devices, magnetic devices, piezoelectric devices, surface acoustic devices, etc. including semiconductor integrated circuit, optical integrated circuit, magnetic circuit, etc.

2. Related Background Art

In the prior art, monocrystalline thin film to be used for semiconductor electronic devices, optical devices, etc. has been formed by epitaxial growth on a monocrystalline substrate. However, for epitaxial growth of monocrystalline thin film on a monocrystalline substrate, it is necessary to take into account the matching in lattice constant and coefficient of thermal expansion between the monocrystalline materials of the substrate and the epitaxial growth layer, and there has been involved the problem that the kind of substrate material is limited to an extremely narrow scope for formation of monocrystalline layer capable of providing a device of good quality.

Further, in recent years, research and development have been actively done about three-dimensional integrated circuits for accomplishing high integration and multi-functionality by forming semiconductor devices by lamination in the direction normal to the substrate, and also research and development about large area semiconductor devices such as solar battery in which elements are arranged in an array on an inexpensive glass or switching transistor for liquid crystal picture elements, etc. are becoming more active year by year.

What is common in these researches and developments is that the technique to form a semiconductor film on an amorphous insulating material and form an electronic device such as transistor, etc. thereon is required. Among them, it has been particularly desired to have a technique to form a monocrystalline semiconductor film of high quality on an amorphous insulating material.

However, generally speaking, when a thin film is formed on an amorphous insulating substrate such as $SiO_2$, etc., due to deficiency of long length order of the substrate material, the crystal structure of the deposited film will become amorphous or polycrystalline, whereby it is very difficult to form monocrystalline semiconductor of high quality. Here, amorphous film refers to one with the state in which although short length order to such an extent as the minimum order of neighbor atoms may be maintained, there is no particular order of longer length, while polycrystalline film refers to one in which monocrystal grains having no specific crystal direction are gathered as separated with grain boundaries.

As a solution of the problems as mentioned above in the prior art, European Patent Application EP 244081A1 proposes a method for forming crystal by preparing a substrate having a nonnucleation surface having a small nucleation density and a nulceation surface having a sufficiently larger nucleation density than the nonnucleation surface and a minute area such that only a single nucleus can be formed, then forming a single nucleus on the nucleation surface and permitting a monocrystal to grow from the single nucleus as the growing center, and it is shown possible to form a monocrystal even on the substrate surface of amorphous material by use of the above method.

On the other hand, semiconductor devices such as MOS type transistor, bipolar transistor, SCR, etc. are constituted of a plural number of p-n junction portions formed in combination. For example, in the case of a p-channel MOS type transistor, the device is constituted of p-type semiconductor regions as source region and drain region formed in an n-type semiconductor region.

To form such a semiconductor device on an insulating amorphous substrate by use of the crystal forming method described in the European Patent Application EP 244081A1, a facet of monocrystal is permitted to grow on the substrate, and after flattening of the facet of monocrystal, the conventional semiconductor device production process is practiced. More specifically, after a certain conduction type semiconductor region is formed, ion implantation of n-type impurity or p-type impurity is practiced.

However, the above semiconductor device formation requires ion implantation and diffusion steps thus being complicated while it involves essential difficulty in separate formation of semiconductor regions with high precision which may be attributed to the difficulty in controlling the diffusion process.

SUMMARY OF THE INVENTION

An object of the present invention is to provide a process for producing a semiconductor article enabling easily forming semiconductor regions having different characteristics, e.g. conduction type as mentioned above, in a monocrystal thus simplifying the production steps significantly.

The inventive process for producing a semiconductor article comprises applying crystal formation treatment to a substrate having a free surface on which a nonnucleation surface exhibiting a smaller nucleation density and a nucleation surface of an amorphous material exhibiting a larger nucleation density and having a sufficiently minute area so as to allow only a single nucleus to be formed thereon are disposed next to each other whereby a semiconductor monocrystal is permitted to grow from the nucleus, the production conditions during said crystal formation treatment being varied to form semiconductor crystal regions different in their characteristics within at least part of said semiconductor monocrystal.

Here, the term 'monocrystal' means one having a substantially monocrystalline structure regardless of existance of some lattice defects.

In the present invention, nucleus formation on nonnucleation surface is precluded by applying crystal formation treatment to a substrate having a free surface on which a nonnucleation surface exhibiting a smaller nucleation density and a nucleation surface of an amorphous material exhibiting a larger nucleation density and having a sufficiently minute area so as to allow only a single nucleus to be formed thereon are disposed next to each other thereby permitting a monocrystal to grow from the single nucleus as the growing center, and semiconductor crystal regions different in their characteristics are formed within at least part of the semiconductor monocrystal by varying the production conditions such as the kind and composition ratio of deposition material, the kind and amount of impurity, etc. in the step of permitting a semiconductor monocrystal to grow.

In the present invention, by flattening the protruding portion of a semiconductor monocrystal and exposing semiconductor crystal regions different in characteristics, the semiconductor crystal regions are formed closely next to each other with forming a nearly right angle with reference to the substrate.

In the present invention, by forming a plurality of semiconductor crystal regions different in characteristics and then dividing at least one semiconductor crystal region by use of fine working, a plurality of semiconductor crystal regions having the same characteristics are formed separately and simultaneously.

BRIEF DESCRIPTION OF THE DRAWINGS

FIGS. 1A-1D illustrate an embodiment of the process for producing a semiconductor article of the present invention.

FIGS. 2A-2D illustrate another embodiment of the process for producing a semiconductor article of the present invention.

DESCRIPTION OF THE PREFERRED EMBODIMENTS

Figure 3A:
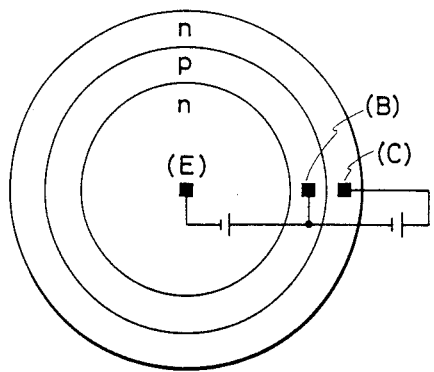
FIGS. 3A and 3B, FIGS. 4A and 4B, FIGS. 5A-5C, FIGS. 6A and 6B, FIGS. 7A and 7B, FIGS. 8A and 8B and FIGS. 9A and 9B illustrate a variety of semiconductor devices using the semiconductor article of the present invention.

The present invention is described in detail below by referring to the drawings specifically.

First, for better understanding of the crystal growth method shown in the European Patent Application EP 244081A1, the selective deposition method for forming selectively a deposited film on the deposition surface is explained. The selective deposition method is a method for selectively forming a thin film on a substrate by utilizing the difference between materials in factors influencing nucleation in the thin film forming process such as surface energy, adsorption coefficient, desorption coefficient, surface diffusion speed, etc.

Figure 10A:
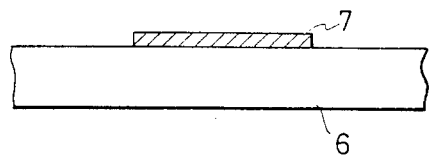
FIGS. 10A and 10B illustrate the selective deposition method.
Figure 10B:
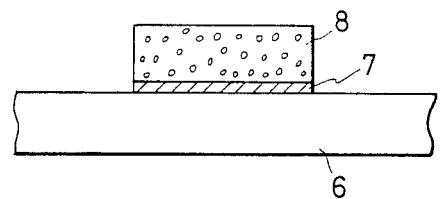

FIGS. 10A and 10B illustrate the selective deposition method.

First as shown in FIG. 10A, on a substrate 6, a thin film 7 constituted of a material different in the above factors from the substrate 6 is formed at a desired portion. And, by performing deposition of a thin film of a suitable material under suitable deposition conditions, it is possible to cause a phenomenon to occur that a thin film grows only on the thin film 7 without growth on the substrate 6. By utilizing the above phenomenon, a thin film 8 can be grown, as self-aligned whereby it becomes possible to omit the lithographic step using a resist conducted in the prior art.

As materials for the selective deposition method, there may be employed, for example, SiO$_2$ as the substrate 6, Si, GaAs, and silicon nitride as the thin film 7, Si, W, GaAs, InP, etc. as the thin film 8 to be deposited.

Figure 11:
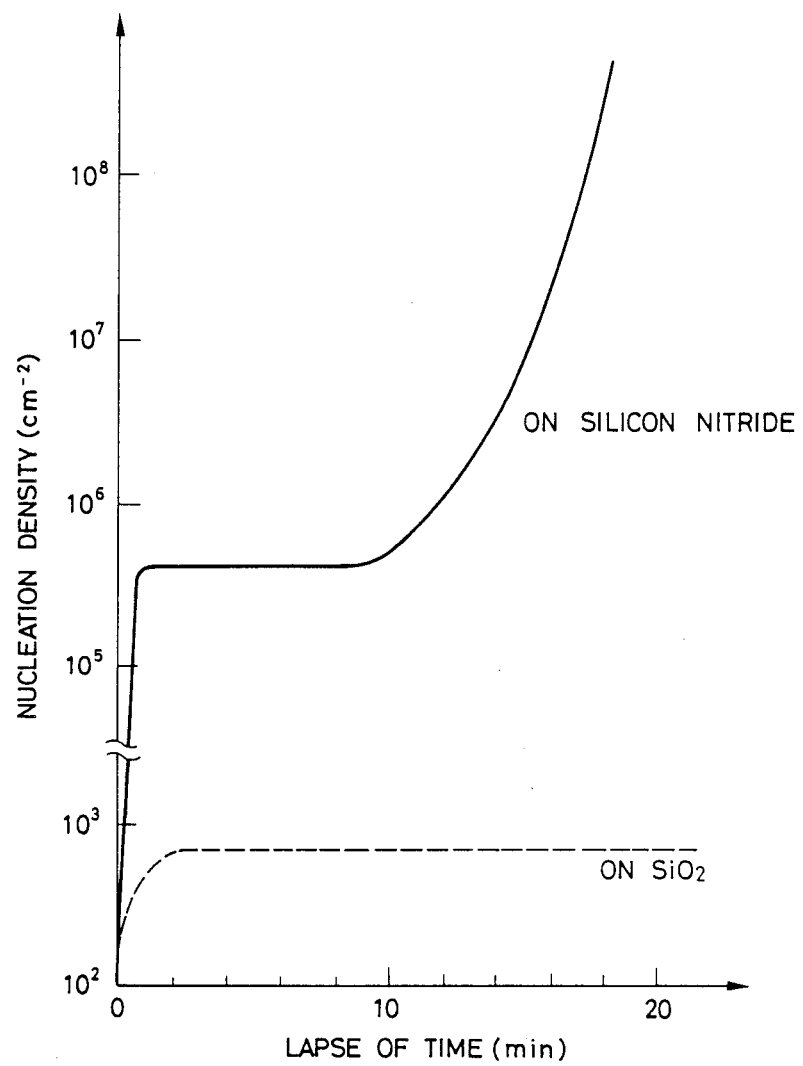
FIG. 11 is a graph showing the changes of nucleation density with lapse of time on SiO$_2$ and silicon nitride surfaces.

FIG. 11 is a graph showing the changes of nucleation density with lapse of time on the deposition surface of SiO$_2$ and the deposition surface of silicon nitride.

As shown in FIG. 11, soon after initiation of deposition, the nucleation density on SiO$_2$ is saturated at less than $10^3$cm$^{-2}$, and its value is substantially unchanged even after 20 minutes.

In contrast, on silicon nitride (Si$_3$N$_4$), the density is once saturated at ca. $4 \times 10^5$ cm$^{-2}$, and is not changed for 10 minutes thereafter, but is subsequently abruptly increased. In this measurement example, there is shown the case in which SiCl$_4$ gas is diluted with H$_2$ gas, and deposited according to the CVD method under the conditions of a pressure of 175 Torr and a temperature of 1000° C. Otherwise, the same effect can be obtained by using SiH$_4$, SiH$_2$Cl$_2$, SiHCl$_3$, SiF$_4$, etc. as the reactive gas and controlling the pressure, temperature, etc., appropriately. Also, vacuum vapor deposition may be available.

In this case, although nucleation on SiO$_2$ poses substantially no problem, nucleation on SiO$_2$ can be further inhibited by addition of HCl gas in the reactive gas, whereby deposition of Si on SiO$_2$ can be made zero.

Such phenomenon owes greatly to the differences in adsorption coefficient, desorption coefficient, surfaces diffusion coefficient, etc. with reference to Si between the material surfaces of SiO$_2$ and silicon nitride, but it may be also considered as a cause for selective deposition that SiO$_2$ itself is etched through the reaction of SiO$_2$ with Si to form silicon monooxide with high vapor pressure, while no such etching phenomenon occurs on silicon nitride (T. Yonehara, S. Yoshioka, S. Miyazawa, Journal of Applied Physics 53, 6839, 1982).

Thus, by selecting SiO and silicon nitride as the materials of the deposition surface and selecting silicon as the material to be deposited, sufficiently great nucleation density difference as shown in FIG. 11 can be obtained. Here, although SiO$_2$ is desirable as the material of the deposition surface, this is not limitative but also SiO$_x$ can also obtain sufficiently practical nucleation density difference.

Of course, the present invention is not limited by the use of these materials, and if the nucleation density difference is 10-fold or more, preferably $10^3$-fold or more, in terms of the density of nucleus as shown in FIG. 11, selective formation of a deposited film can be performed effectively with other materials as exemplified below.

As another method for obtaining such nucleation density difference, a region containing excessively Si, N, etc. may be formed by ion implantation of Si, N, etc. locally on SiO$_2$ surface.

By utilizing the above selective deposition method and forming a nucleation surface exhibiting sufficiently greater nucleation density than the material of the bulk deposition surface and having a sufficiently minute area so that only a single nucleus may be formed, a monocrystal is grown selectively only at the site where the minute nucleation surface forming material exists.

Since the selective growth of monocrystal is determined depending on the electron state of the deposition surface, particularly the state of dangling bond at the surface, the material with lower nucleation density (e.g. SiO$_2$) is not required to be a bulk material, but it may be formed only on the surface of any desired material or substrate, etc. to form the above deposition surface.

Figure 12A:
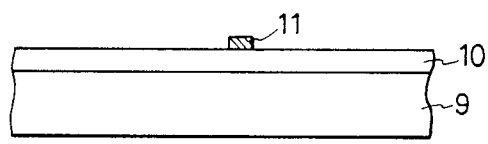
FIGS. 12A-12C illustrate an example of monocrystal formation involved in the process of the present invention.
Figure 12B:
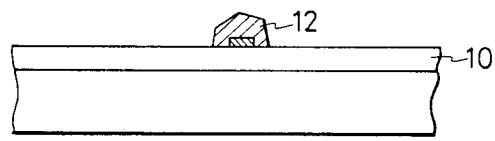
Figure 12C:
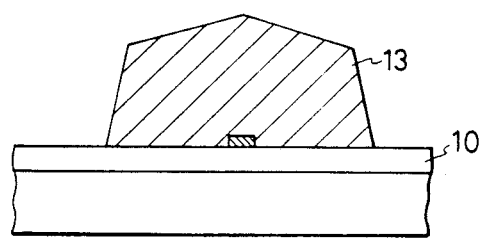
Figure 13A:
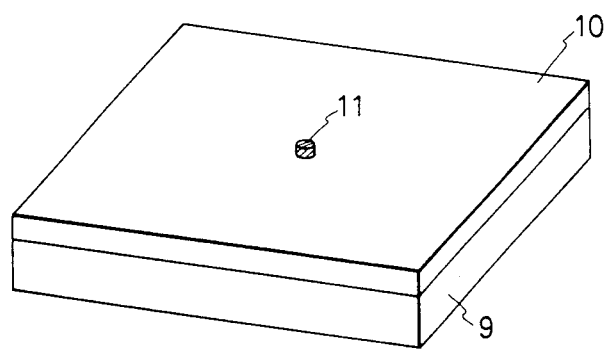
FIGS. 13A and 13B are perspective views of FIGS. 12A and 12C, respectively.
Figure 13B:
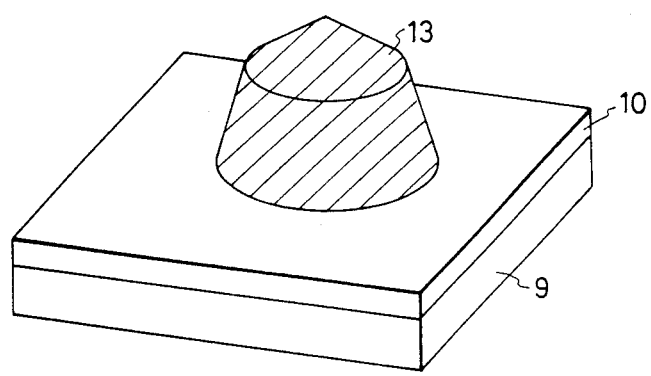

FIGS. 12A-12C illustrate diagramatically an example of the steps for forming a monocrystal of the selective deposition method, and FIGS. 13A and 13B are perspective views of FIGS. 12A and 12C.

First, as shown in FIGS. 12A and 13A, on the substrate 9, a thin film 10 with a small nucleation density as enabling selective nucleation is formed, and a nucleation surface forming material with a larger nucleation density is thinly deposited thereon, followed by patterning by lithography, etc. to form sufficiently minutely the nucleation surface 11. However, the size, the crystal structure and the composition of the substrate 9 may be as desired, and it may be also a substrate having a functional element formed thereon. Also, the nucleation surface 11 may be a modified region having excessively Si, N, etc. formed by ion implantation of Si, N, etc. to the thin film 10, as described above.

Next, by selecting appropriate deposition conditions, a single nucleus of the thin film material is formed only on the nucleation surface 11. That is, the nucleation surface 11 is required to be formed sufficiently minutely to the extent that only a single nucleus may be formed. The size of the nucleation surface 11, which depends on the kind of the material, may be several microns or less. Further, the nucleus grows with maintaining its monocrystalline structure to become a monocrystal grain 12 shaped in an island as shown in FIG. 12B. For the island-shaped monocrystal grain 12 to be formed, it is desirable to determine the conditions so that no nucleation may occur at all on the thin film 10.

The island shaped monocrystal grain 12 further grows with maintaining its monocrystalline structure around the nucleation surface 11 as the growing center to become a monocrystal 13 as shown in FIG. 12C.

Subsequently, the monocrystal 13 is flattened by etching or polishing to form a monocrystal layer on the thin film 10, on which a desired element can be formed.

Thus, since the thin film 10 which is the material of the deposition surface is formed on the substrate 9, any desired material can be used as the substrate 9 which is the supporting member. Further, even if the substrate 9 may be one having a functional element, etc., a monocrystal layer can be easily formed thereon.

In the above embodiment, the material of the deposition surface was formed with the thin film 10, but a substrate comprising a material with a small nucleation density as enabling selective nucleation may be used as such, and a monocrystal layer may be formed similarly.

The monocrystal growth method as described above may be also practiced according to the production steps as follows.

Figure 14A:
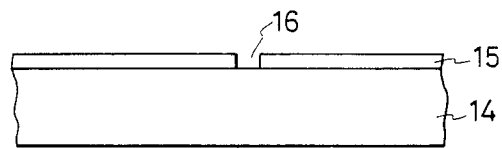
FIGS. 14A-14C illustrate another example of monocrystal formation involved in the process of the present invention.
Figure 14B:
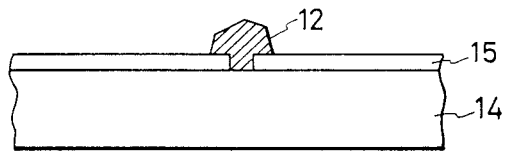
Figure 14C:
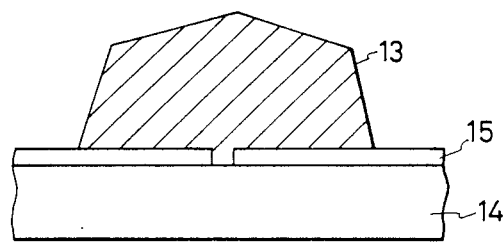
Figure 15A:
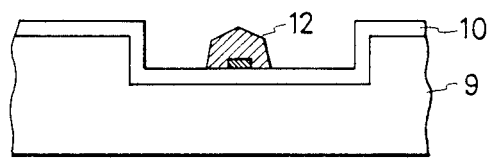
FIGS. 15A and 15B illustrate monocrystal formation in case of forming a monocrystal within a recession of substrate surface.
Figure 15B:
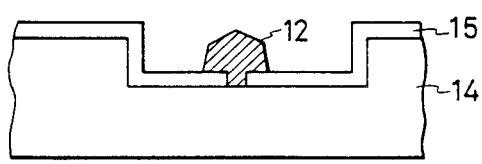

FIGS. 14A-14C show diagramatically the steps of another example of the process for forming a monocrystal of the selective nucleation method.

As shown in FIG. 14A, in this example, on the nucleation surface forming material substrate 14, an insulating layer 15 of the nonnucleation surface forming material is formed, and then an opening 16 is formed. On the surface forming material exposed through the opening 16, a single nucleus is formed as shown in FIGS. 4B and 14C similarly as in the example shown in FIGS. 2A-12C and FIGS. 13A and 13B, and the single crystal grain 12 is permitted to grow around the single nucleus as the growing center, and further deposition is continued to form a monocrystal 13, whereby those equivalent to the monocrystal shown in FIG. 12C, and FIG. 13B can be prepared.

The nucleation surface can be prepared by forming a nucleation surface forming material layer on a desired substrate, as a matter of course.

Although the deposition surface is flat in the above-described examples of monocrystal forming method, a monocrystal may be formed by forming a nucleation surface 11 or an opening 16 on the bottom surface of a recession and permitting a monocrystal grain 12 to grow around a single nucleus formed on the nucleation surface 11 or in the opening 16.

Next, the process for producing a semiconductor article of the present invention is explained.

Although, in the following, the present invention is explained regarding the case of forming p-type and n-type semiconductor crystal regions by use of different kinds of dopants as an aspect of the present invention, it should not be restricted to this aspect but is applicable preferably to the case of forming laminated semiconductor layers of different compositions such as laminated layers of GaAs and AlGaAs in a super high speed transistor or semiconductor laser.

FIGS. 1A-1D show diagrammatically the steps for producing a semiconductor article of the first embodiment of the present invention.

In FIG. 1A, a seed 2 formed of the nucleation surface forming material is formed by fine patterning on the substrate 1. As the material for the substrate 1, for example, SiO$_2$ may be employed. The substrate 1 may be prepared by forming an SiO$_2$ layer on a desired substrate such as semiconductor, magnetic material, piezoelectric material, insulating material, etc. by the sputtering method, the normal pressure CVD method, the vacuum vapor deposition method, etc. As the nonnucleation surface material, SiO$_2$ is desirable, but SiO$_x$ with the value of x being varied may be also available.

By depositing a silicon nitride layer (here Si$_3$N$_4$ layer) or a polycrystalline silicon layer as the nucleation surface on the substrate 1 of SiO$_2$ by the reduced pressure vapor phase growth method, and subjecting the silicon nitride layer to patterning by conventional lithographic technique or lithographic technique by use of X-ray, electron beam or ion beam, a minute substantially square seed 2 with a thickness of about 300 Å and a size of about 1 to 4 μm is formed.

Next, as shown in FIG. 1B, Si epitaxial growth is practiced on the seed 2 by use of conventional epitaxial growth method. At this time, by setting the production conditions at appropriate conditions, no Si nucleus is formed on the substrate 1 of SiO$_2$, and an Si nucleus is formed selectively only on the seed 2 of Si$_3$N$_4$.

In the present invention, during the stage when a monocrystal is formed by growing a single nucleus on the seed 2, an impurity of desired kind and amount is doped for a desired time to form a specific conduction type semiconductor region of a desired kind with a desired size and at a desired position within the monocrystal.

The conditions for effecting selectively nucleation of Si monocrystal on the seed 2 on the substrate 1 may be, for example, flow rates of SiH$_2$Cl$_2$, HCl, H$_2$, respectively, of 0.6 l/min., 1.0 l/min. and 100 l/min., with mixing of desired amounts of doping gas (PH$_3$, B$_2$H$_6$, etc.), a temperature of 960° C. and a pressure of 150 Torr, whereby no Si nucleus is formed on the substrate 1 and an Si nucleus can be selectively formed only on the seed 2 to prepare a p-type or n-type conduction type semiconductor crystal region with a desired size at a desired position within the monocrystal.

In this example, as shown in FIG. 1B, at the initial stage of growth of the monocrystal, a doping gas of the n-type is used to permit an n-type semiconductor crystal region (hereinafter referred to as n-type region) 3 with an appropriate size to grow, and then by changing over the doping gas to the p-type, a p-type semiconductor crystal region (hereinafter referred to as p-type region) 4 is epitaxially grown continuously on the n-type region 3. Further, similarly, when the p-type region 4 has reached a certain thickness, the doping gas is changed over to the n-type, and an n-type region 5 is epitaxially grown continuously to prepare an island-shaped Si monocrystal having n-p-n layers laminated continuously as shown in FIG. 1B.

Next, as shown in FIGS. 1C and 1D, by flattening of the Si monocrystal grown in island shape at an appropriate level, a semiconductor article can be produced. The semiconductor article in this example is a truncated cone, with the n-type Si monocrystal 3, the p-type Si monocrystal 4 and the n-type Si monocrystal 5 being formed in this order, as shown in FIGS. 1C and 1D.

Typical flattening may include the lapping-polishing method and the etch-back method.

The lapping-polishing method is a method in which Si monocrystal is ground mechanically from the upper part (lapping) and further the surface is subjected to mirror surface finishing by chemical treatment and polishing (polishing).

The etch-back method is a method in which a resist is applied flatly to an appropriate thickness so as to cover Si monocrystal and the resist and Si monocrystal are etched together by RIE (Reactive-Ion-Etching).

In the above embodiment of the process for producing a semiconductor article, p-type, n-type and p-type layers are laminated to form p-n-p junction, but p-n-p junction may be formed from only p-type layer and n-type layer.

FIGS. 2A–2D show diagramatically the steps of second embodiment of the process for producing a semiconductor article of the present invention.

In this embodiment, the same reference denotes the same constituting member as in the first embodiment, and since the production process generally follows the same steps, the following explanation is focused to the characterizing part making the difference between the two embodiments.

In an example of this embodiment, as shown in FIG. 2B, at the initial stage of growth of the monocrystal, a doping gas of the n-type is used to permit an n-type semiconductor crystal region (n-type region) 3 with an appropriate size to grow, and then by changing over the doping gas to the p-type, a p-type semiconductor crystal region (p-type region) 4 is epitaxially grown continuously on the n-type region 3, thereby preparing an island-shaped Si monocrystal having n-p layers laminated continuously.

Next, as shown in FIG. 2C, by flattening of the Si monocrystal grown in island shape at an appropriate level, the monocrystal is formed in the shape of truncated cone with the p-type region 4 being arranged outside of the n-type region 3.

Next, as shown in FIG. 2D, the p-type region 4 is divided into two portions by use of fine working technique to form p-type regions 4a and 4b.

Fine working technique is not particularly limited, but working can be practiced by use of the lithographic technique comprising conventional resist process and etching process.

The resist process comprises the steps of resist coating, exposure, developing and hard baking, and for patterning of the resist, UV-ray, electron beam, X-ray, etc. may be employed depending on the precision required.

For the etching process, both wet etching and dry etching may be available, and it is desirable to use a method capable of anisotropic etching such as reactive ion etching, etc. when high precision is required.

A variety of semiconductor devices can be fabricated by use of the semiconductor article produced according to the process for producing a semiconductor article of the present invention as described above.

The case of forming a bipolar transistor on the semiconductor article prepared in the steps as described above is explained below. A conventional semiconductor production process may be employed for forming such a bipolar transistor.

Figure 3B:
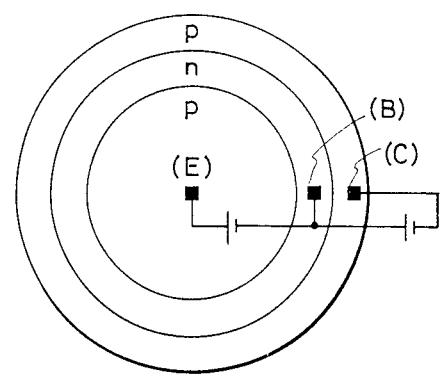

FIG. 3A illustrates a constitution of an n-p-n type bipolar transistor by use of the semiconductor article produced by the first embodiment of the present invention, and FIG. 3B a constitution of a p-n-p type bipolar transistor.

As shown in FIG. 3A, the n-p-n type bipolar transistor has an emitter electrode ((E) in the Figure, the same symbol is used in the following examples) formed in the n-type semiconductor region at the inner side of the semiconductor article as shown in FIGS. 1C and 1D, a base electrode in the p-type semiconductor region ((B) in the Figure, the same symbol is used in the following examples) and a collector electrode ((C) in the Figure, the same symbol is used in the following examples) in the outer n-type semiconductor region.

Also, as shown in FIG. 3B, the p-n-p type bipolar transistor, by changing the order of the doping gases added in the monocrystal growth process, is formed from a semiconductor aritcle with conduction types opposite to those of the semiconductor article shown in FIGS. 1C and 1D and has an emitter electrode formed in the inner p-type semiconductor region of the semiconductor article, a base electrode in the n-type semiconductor region and a collector electrode in the outer p-type semiconductor region.

Figure 4A:
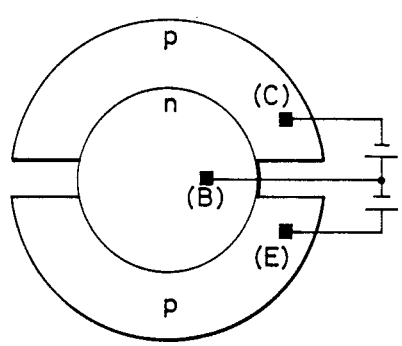
Figure 4B:
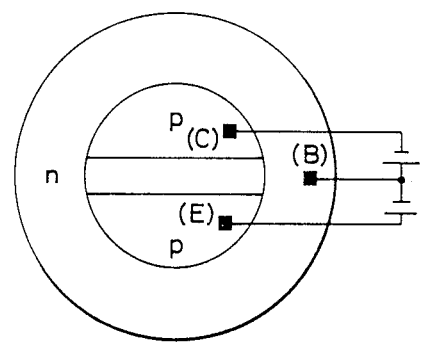

FIG. 4A is a constitutional illustration of the p-n-p type bipolar transistor by use of the semiconductor article produced by the second embodiment of the present invention.

As shown in FIG. 4A, the p-n-p type bipolar transistor has a base electrode in the n-type region arranged at the inner side of the semiconductor article shown in FIG. 2D, an emitter electrode in the p-type region 4b and a collector electrode in the p-type region 4a.

In the above semiconductor article, the outer p-type region 4 is divided to constitute a p-n-p type bipolar transistor, but it is also possible to form a p-n-p type bipolar transistor by dividing the inner semiconductor crystal region.

FIG. 4B is a constitutional illustration showing another example of the p-n-p bipolar transistor according to the second embodiment of the present invention.

As shown in FIG. 4B, in the monocrystal growth process, by changing the order of doping gases added, a semiconductor crystal region with conduction types opposite to those of the semiconductor crystal region shown in FIG. 2C is formed, and the inner p-type region is divided into two p-type regions to form a collector electrode, an emitter electrode, respectively, and a base electrode is formed in the outer n-type region.

As a semiconductor device for which the process for producing the semiconductor article of the present invention is used, other than bipolar transistor, there can be exemplified junction type field effect transistor, MOS type field effect transistor, rectifying device, SCR, triac, etc.

In the following, examples in which the production process of the present invention is used for the semiconductor article of such a semiconductor device are described.

Figure 5A:
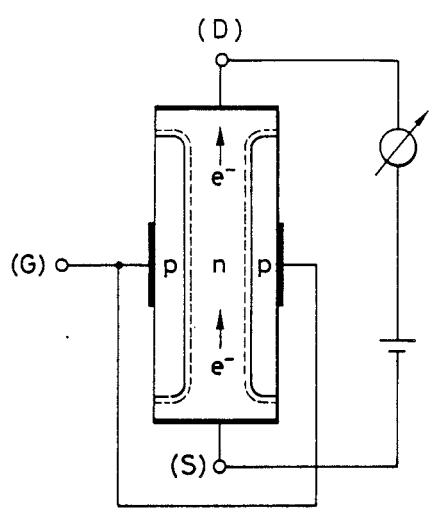
Figure 5B:
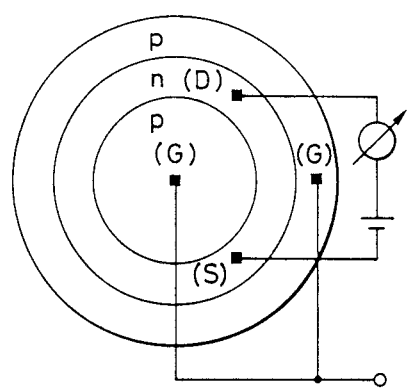
Figure 5C:
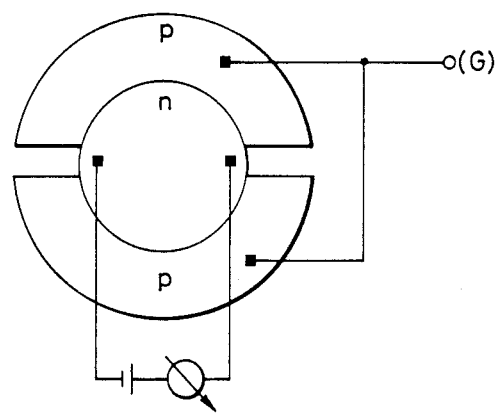

(1) Junction type field effect transistor:

FIG. 5A is a constitutional illustration of actuation of a junction type field effect transistor, and FIGS. 5B and 5C are constitutional illustrations of junction type field effect transistors formed according to the present invention.

As shown in FIG. 5A, the general basic constitution of a junction type field effect transistor comprises p-type semiconductor regions on both sides of the n-type semiconductor region sandwiched therebetween, further gate electrodes ((G) in the Figure, the same symbol is used in the respective examples shown below) in the two p-type semiconductor regions, a source electrode ((S) in the Figure, the same symbol is used in the respective examples shown below) and a drain electrode ((D) in the Figure, the same symbol is used in the respective examples shown below) in the n-type semiconductor region so as to be perpendicular to the opposed gate electrodes, and by controlling the width of the channel for electrons from the source to the drain by the field effect of the voltage applied on the gate, the current between the source and the drain is controlled.

When the junction type field effect transistor is prepared by use of the semiconductor article produced according to the first embodiment of the present invention, as shown in FIG. 5B, the respective desired impurities are doped at the stage when a monocrystal is grown to form an n-type semiconductor region on the first p-type semiconductor region, and further after formation of the second p-type semiconductor region, the monocrystal is flattened and is provided with gate electrodes in the first p-type semiconductor region and the second p-type semiconductor region, and a source electrode and a drain electrode are formed in the n-type semiconductor region with a certain distance therebetween.

When the aforesaid junction type field effect transistor is prepared by use of the semiconductor article produced according to the second embodiment of the present invention, as shown in FIG. 5C, the respective desired impurities are doped at the stage when a monocrystal is grown to form n-type and p-type semiconductor regions, then the monocrystal is flattened and the p-type semiconductor region is devided into two p-type semiconductor regions followed by formation of gate electrodes thereon respectively and of source and drain electrodes spaced from each other by a certain distance.

(2) MOS type field effect transistor

Figure 6A:
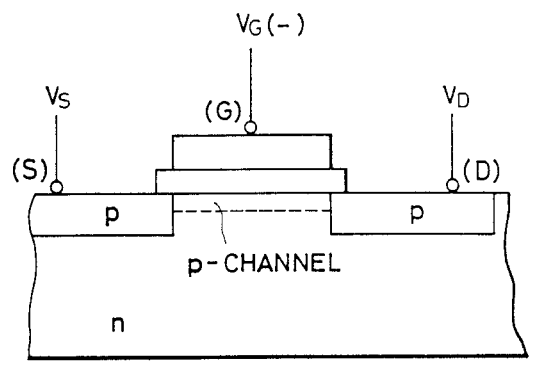
Figure 6B:
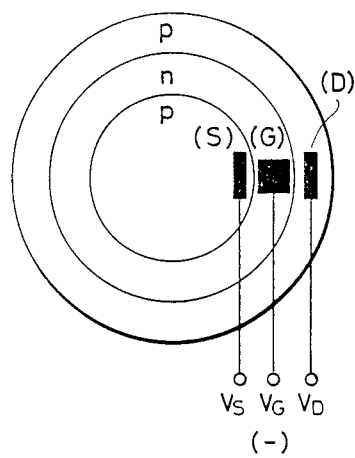

FIG. 6A is a constitutional illustration of a MOS type field effect transistor, and FIG. 6B is a constitutional diagram of a junction type field effect transistor formed by the present invention.

As shown in FIG. 6A, the general constitution of the MOS type field effect transistor (here description is made about the p-channel MOS type field effect transistor) has two p-type semiconductor regions with a certain distance therebetween in an n-type semiconductor substrate, and gate electrodes of Al, etc. formed with interposing an insulating film on the n-type semiconductor region sandwiched between these p-type semiconductor regions. When the gate is at zero potential, p-n junction stops current, but when a negative potential (in the case of p-channel MOS transistor) is applied, through its field effect, a p-channel layer is generated at the interface between the gate oxide film and the n-type semiconductor substrate, whereby current can be passed between the source and the drain.

When the MOS type field effect transistor is prepared by use of the semiconductor substrate produced according to the present invention, the respective desired impurities are doped in the stage when a monocrystal is grown, and an n-type semiconductor region is formed on the first p-type semiconductor region, and further after formation of the second p-type semiconductor region thereon, the monocrystal is flattened, and a drain electrode is formed in the first p-type semiconductor region, a gate electrode in the n-type semiconductor region and a source electrode in the second p-type semiconductor region.

Figure 7A:
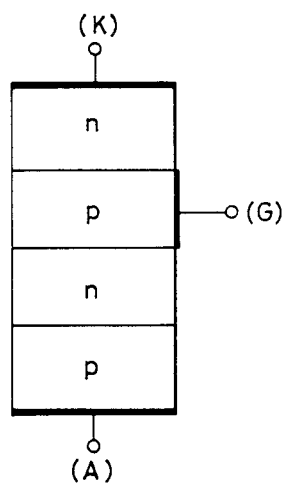
Figure 7B:
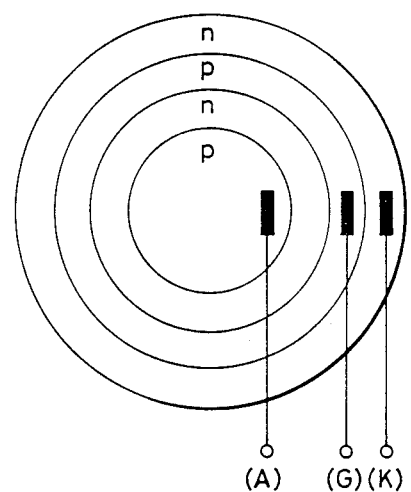

(3) SCR:

FIG. 7A is a constitutional illustration of actuation of an SCR, and FIG. 7B is a constitutional illustration of an SCR formed according to the present invention.

As shown in FIG. 7A, the general constitution of an SCR comprises a four-layer structure having p-type semiconductor regions and n-type semiconductor regions laminated alternately, having anode electrode ((A) in the Figure) and cathode electrode ((K) in the Figure) formed respectively in the p-type semiconductor region and the n-type semiconductor region at the both ends, and a gate electrode ((G) in the Figure) in the p-type semiconductor region sandwiched between the both n-type semiconductor regions, and the device functions like a diode which can control the current passage time in the normal direction current, having stable switching function in the two directions. More specifically, it is a device capable of producing the following states:

(a) The "reverse-blocking state" when positive voltage is applied on the cathode and negative voltage on the anode. This state has nothing to do with the gate electrode.

(b) The "off state" when positive voltage is applied on the anode, negative voltage on the cathode, and zero or negative voltage on the gate.

(c) The "on state" when positive voltage is applied on the gate of the SCR under off state.

When the SCR is prepared by use of the semiconductor article produced according to the first embodiment of the present invention, after lamination of the first n-type semiconductor region, the first p-type semiconductor region, the second n-type semiconductor region and the second p-type semiconductor region in this order by doping of the respective desired impurities at the stage of growing a monocrystal, the monocrystal is flattened, and a cathode electrode is connected to the first n-type semiconductor region, a gate electrode to the first p-type semiconductor region and an anode electrode to the second p-type semiconductor region.

Figure 8A:
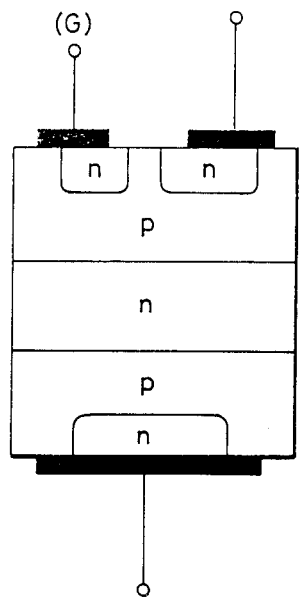
Figure 8B:
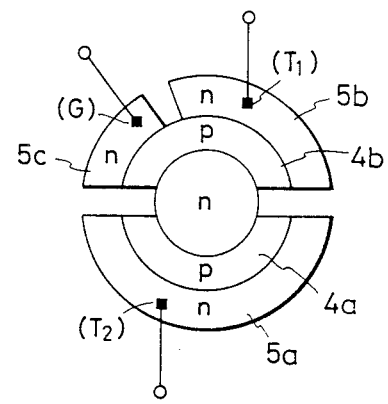

(4) Triac:

FIG. 8A is a constitutional illustration of a triac and FIG. 8B is a constitutional illustration of the triac by use of the semiconductor article according to the present invention. As to the preparation steps of the semiconductor article, they are approximately the same as those for the semiconductor article shown in FIGS. 1A-1D, and detailed description is omitted.

Triac is a tripolar device capable of AC control. It is equivalent to SCR arranged in reverse parallel, and a signal of either positive or negative can be given as the trigger to the gate to enable turn off.

When a triac is prepared by use of the semiconductor article produced according to the second embodiment of the present invention, similarly as in the preparation steps shown in FIGS. 2A-2D, in the monocrystal growth process, by changing the order of the doping gases added and laminating an n-type region, a p-type region and an n-type region by lamination, and thereafter flattening the island-shaped Si monocrystal grown at an appropriate level, the Si monocrystal can be made a truncated cone to form an n-type region, a p-type region and an n-type region outward in this order. The outer n-type region and the p-type region are divided into two portions, and further one of the divided n-type regions is divided into two portions, thus forming three n-type regions $5a$, $5b$ and $5c$ and two p-type regions $4a$ and $4b$. By forming primary electrodes (($T_1$), ($T_2$) in the Figure) in the n-type regions $5a$ and $5b$ and a gate electrode ((G) in the Figure) in the n-type region $5c$, a triac with a 5-layer constitution of n-p-n-p-n is formed.

Figure 9A:
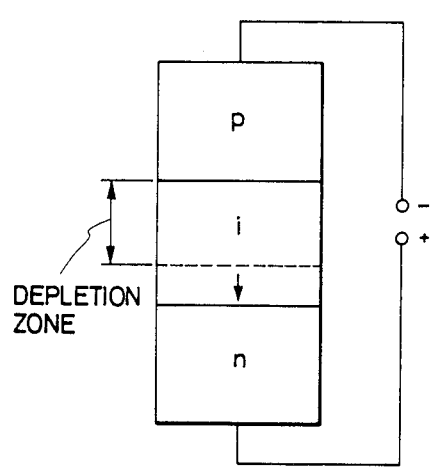
Figure 9B:
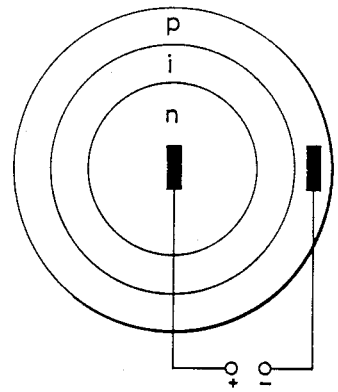

(5) Rectifying device:

FIG. 9A is a constitutional illustration of actuation of an example of a rectifying element, and FIG. 9B a constitutional illustration of a rectifying element formed according to the present invention.

As shown in FIG. 9A, the basic constitution of the rectifying element in this example comprises a p-type semiconductor region and an n-type semiconductor region on both sides with an i (intrinsic) type semiconductor region sandwiched therebetween, which may be preferably used for uses with relatively greater consumption power.

When the rectifying element is prepared by use of the semiconductor article produced according to the first embodiment of the present invention, a p-type semiconductor region is formed by doping of a p-type impurity at the stage when a monocrystal is grown, an i-type semiconductor region is formed thereon, further an n-type semiconductor region is formed by doping of an n-type impurity, followed by formation of electrodes in the p-type semiconductor region and the n-type semiconductor region. Of course, by omitting deposition of the intermediate i-type semiconductor region, merely a diode with only p-n junction may be produced.

As explained above, according to the process for producing a semiconductor article, semiconductor crystal regions different in characteristics can be formed very easily at a desired thickness and position within at least part of a semiconductor monocrystal by varying the production conditions such as the kind and $ composition ratio of deposition material, the kind and amount of impurity, etc.

In the present invention, by flattening the protruding portion of a semiconductor monocrystal and exposing semiconductor crystal regions different in characteristics to form them closely next to each other at a desired thickness and position with forming a nearly right angle with reference to the substrate, the width, depth, etc. of a semiconductor crystal region becomes controllable with high precision.

In the present invention, by forming a plurality of semiconductor crystal regions different in characteristics and then dividing at least one semiconductor crystal region by use of fine working to form separately semiconductor crystal regions having the same characteristics simultaneously and easily with high precision, it becomes possible to reduce the number of lamination and simplify the process in producing a semiconductor device comprising semiconductor crystal regions of the same material with interposing a semiconductor crystal region of a different material therebetween.

We claim:

1. A process for producing a semiconductor article comprising a monocrystal having at least two crystal regions differing in electrical characteristics, said process comprising the steps of:
    preparing a substrate having a free surface including a nonnucleation surface and an adjacently positioned nucleation surface of an amorphous material having a greater nucleation density than said nonnucleation surface and having a surface area sufficiently small so as to form only a single nucleus from which said monocrystal is grown;
    applying a first set of crystal growing conditions to said substrate during single nucleus formation to form a first crystal region of said monocrystal which is grown from said amorphous nucleation surface; and
    applying a second set of crystal growing conditions to said substrate to form a second crystal region of said monocrystal.

2. The process of claim 1 wherein said monocrystal is then flattened to expose said crystal regions different in their electrical characteristics.

3. The process of claim 1 wherein at least one of said crystal regions is divided by use of the fine working technique to form a plurality of crystal regions.

4. The process of claim 1 wherein said crystal regions are doped with desired impurities in the step of permitting a monocrystal to grow.

5. The process of claim 4 wherein the condition of said doping is varied stepwise to form continuously crystal regions of desired conduction types.

6. The process of claim 1 wherein said nucleation surface is formed by patterning.

7. The process of claim 1 wherein said nucleation surface is formed by forming a deposition film of said amorphous material on the substrate surface exhibiting said larger nucleation density and making an opening in said film.

8. The process of claim 1 wherein said nucleation surface is formed by applying ion implantation to the substrate surface exhibiting said smaller nucleation density.

9. The process of claim 1 wherein said nucleation surface and nonnucleation surface are formed on a desired underlying material.

* * * * *

UNITED STATES PATENT AND TRADEMARK OFFICE
CERTIFICATE OF CORRECTION

PATENT NO. : 4,983,539                                    Page 1 of 2

DATED     : January 8, 1991

INVENTOR(S) : KENJI YAMAGATA, ET AL.

It is certified that error appears in the above-identified patent and that said Letters Patent is hereby corrected as shown below:

On the title page :

IN [56] REFERENCES CITED

U.S. PATENT DOCUMENTS, "4,064,954  1/1977" should read --4,004,954  1/1977-- and "Jastrzebaski et al." should read --Jastrzebski et al.--.

OTHER PUBLICATIONS, "threshold (60mA) current 1.3 mum CW lasers"." should read --threshold (<60mA) Current 1.3 µm CW Lasers".--.

COLUMN 6

Line 12, "FIGS. 4B" should read --FIGS. 14B--.
    Line 14, "2A-12C" should read --12A-12C--.

COLUMN 10

Line 12, "transistor" should read --transistor:--.
    Line 60, "passage" should read --passage of--.

UNITED STATES PATENT AND TRADEMARK OFFICE
CERTIFICATE OF CORRECTION

PATENT NO. : 4,983,539

DATED : January 8, 1991

INVENTOR(S) : KENJI YAMAGATA, ET AL.

Page 2 of 2

It is certified that error appears in the above-identified patent and that said Letters Patent is hereby corrected as shown below:

COLUMN 12

Line 10, "$" should be deleted.

Signed and Sealed this

Twenty-second Day of September, 1992

Attest:

Attesting Officer

DOUGLAS B. COMER

Acting Commissioner of Patents and Trademarks